United States Patent [19]

Kobayashi

[11] Patent Number: 4,941,146
[45] Date of Patent: Jul. 10, 1990

[54] SEMICONDUCTOR LASER DEVICE
[75] Inventor: Kenichi Kobayashi, Tokyo, Japan
[73] Assignee: NEC Corporation, Tokyo, Japan
[21] Appl. No.: 372,593
[22] Filed: Jun. 28, 1989
[30] Foreign Application Priority Data
  Jun. 29, 1988 [JP] Japan .................................. 63-164034
[51] Int. Cl.[5] .............................................. H01S 3/19
[52] U.S. Cl. ........................................ 372/45; 357/4; 357/16; 357/17; 372/46
[58] Field of Search ................. 372/45, 46, 44; 357/4, 357/17, 16

[56] References Cited
FOREIGN PATENT DOCUMENTS
0015385 1/1986 Japan ..................................... 372/45
0156788 7/1986 Japan ..................................... 372/45
0220492 9/1986 Japan ..................................... 372/45

OTHER PUBLICATIONS
M. B. Panish et al., "Reduction of Threshold Current . . Carrier Confinement", Appl. Phys. Lett., vol. 22, No. 11, Jun. 1, 1973, pp. 590–591.

Primary Examiner—William L. Sikes
Assistant Examiner—Georgia Y. Epps
Attorney, Agent, or Firm—Sughrue, Mion, Zinn, Macpeak & Seas

[57] ABSTRACT

A semiconductor laser device comprises an active layer of a refractive index $n_1$, first and second inner cladding layers of a refractive index $n_2$ and a bandgap energy greater than that of the active layer provided on the both sides of the active layer to form a double heterostructure, and fist and second outer cladding layers of a refractive index $n_3$ provided on the both sides of the double heterostructure. The refractive indices $n_1$, $n_2$ and $n_3$ meet a relation of "$n_1 > n_3 > n_2$", so that a vertical radiation angle of an output light beam is controlled in accordance with a thickness of the first and second inner cladding layers, and the refractive index $n_3$, even if the active layer is thick.

2 Claims, 5 Drawing Sheets

FIG. 2A NORMAL
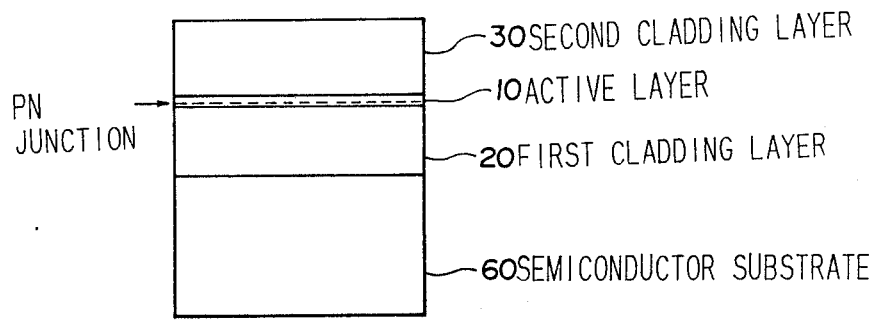
FIG. 2B ABNORMAL (REMOTE JUNCTION)
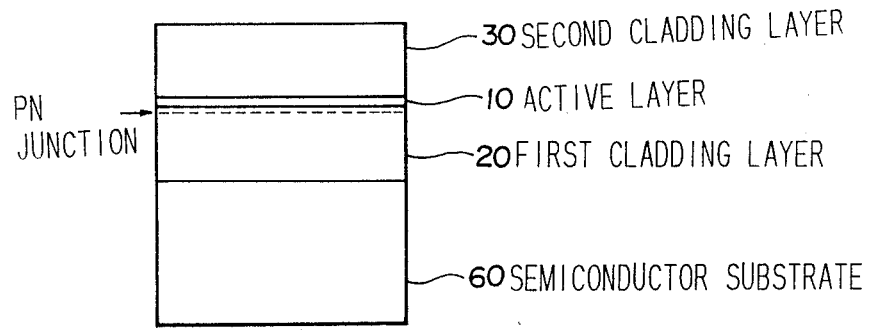

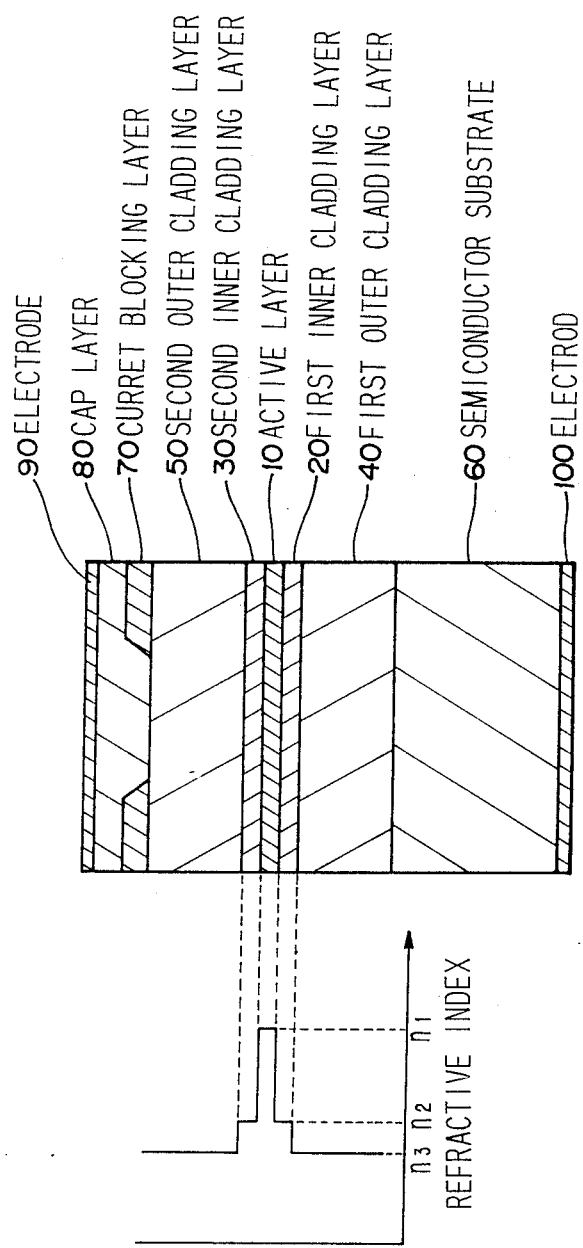

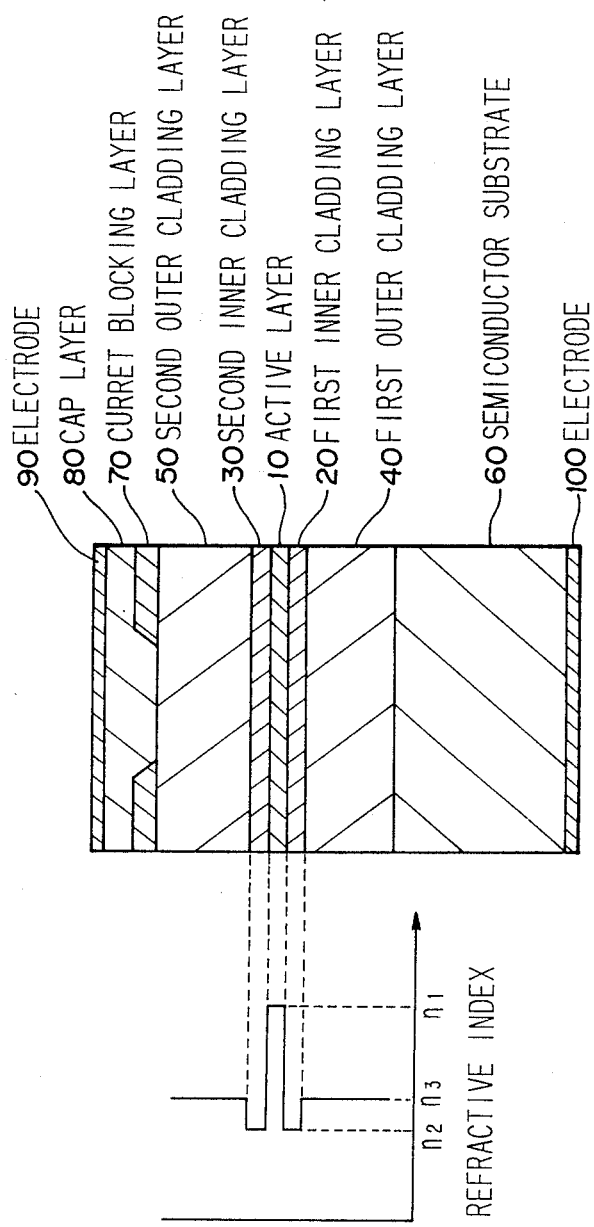

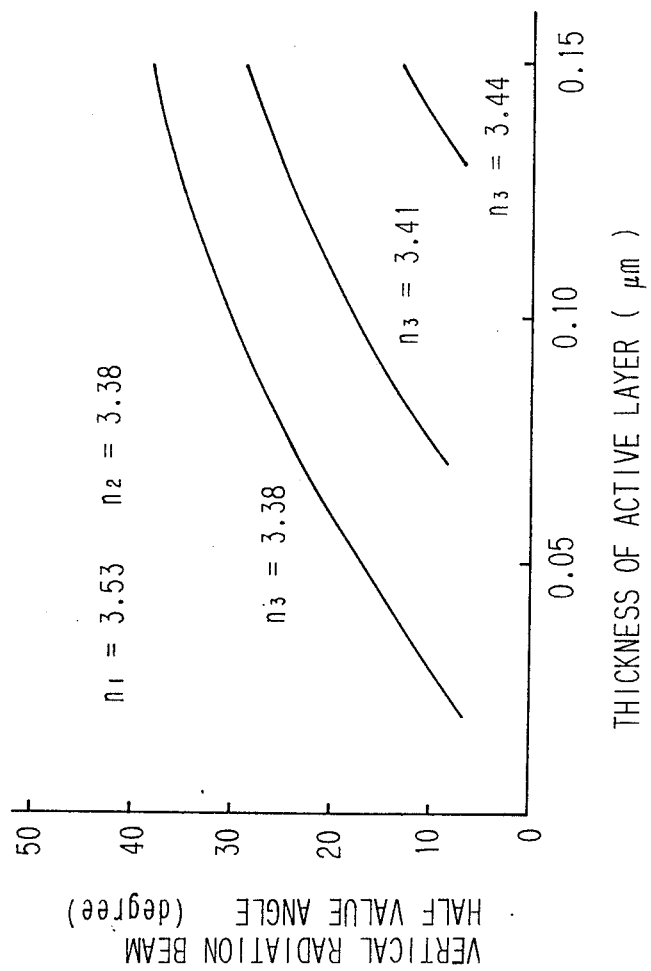

SEMICONDUCTOR LASER DEVICE

FIELD OF THE INVENTION

The invention relates to a semiconductor laser device, and more particularly to a semiconductor laser device in which a vertical radiation angle of an output light beam perpendicular to a plane of an active layer is controlled in accordance with a refractive index difference between an active layer and cladding layers.

BACKGROUND OF THE INVENTION

A semiconductor laser device is widely applied to a light source in an optical communication system, an optical information processing apparatus etc. In the semiconductor laser device, a vertical radiation angle of an output light beam is desired to be small and close to a radiation angle parallel to a plane of an active layer in that the light beam is coupled to a light incident end of an optical fiber in the optical communication system, and that a focusing or collimating lens having a low numerical aperture (NA) is used to provide an optical head of a low cost in the optical information processing apparatus and so on.

In general, a semiconductor laser device comprises a double hetero-structure, wherein a radiation angle of an output light beam having a radiating direction vertical to a plane of an active layer is determined by a thickness of the active layer and a refractive index difference between the active layer and cladding layers provided on both sides of the active layer. The semiconductor laser device, typically, comprises a first cladding layer, an active layer, a second cladding layer, a current blocking layer having an aperture of a stripe shape and a cap layer successively grown on a semiconductor substrate, a first electrode provided on the cap layer, and a second electrode provided on the back surface of the semiconductor substrate, wherein a refractive index $n_1$ of the active layer is more than a refractive index $n_2$ of the first and second cladding layers ($n_1 > n_2$).

In the semiconductor laser device, a vertical radiation angle of an output light beam becomes small as a thickness of the active layer is decreased, and as a refractive index difference between the active layer and the first and second cladding layers becomes small. However, a bandgap energy difference between the active layer and the first and second cladding layers can not be controlled independently of the refractive index difference, because a refractive index of a semiconductor becomes small as a bandgap energy thereof becomes large in accordance with the Kramers-Kronig relation. The bandgap energy difference has a deep connection with a threshold current for a laser oscillation and its temperature dependence, and the refractive index difference has a deep connection with a vertical radiation angle of an output light beam. Where the bandgap energy difference is increased to improve the threshold current and its temperature dependence, the refractive index difference is inevitably increased to result in the increase of the vertical radiation angle.

As described before, the vertical radiation angle becomes small as the active layer thickness is decreased. However, where the active layer thickness is decreased, it is difficult to control the doping and diffusion of an impurity. As a result, a phenomenon called a remote-junction in which a p-n junction is formed inside the first cladding layer away from an interface between the active layer and the first cladding layer often occurs in accordance with an autodoping (diffusion of impurities) in the crystal growth. This phenomenon is remarkably observed in an InGaAsP/InP semiconductor laser device and an AlGaInP/GaAs visible light semiconductor laser device in which Zn is doped. In this point, the doping control becomes easy, where the active layer thickness is as thick as approximately 0.1 μm. However, the active layer thickness of approximately 0.1 μm is generally too thick to provide a low radiation angle of an output light beam.

Here, one type of a conventional semiconductor laser device which is described on pages 590 and 591 of "Appl. Phys. Lett., Vol. 22, No. 11, 1 June 1973" will be explained. The conventional semiconductor laser device comprises an active layer of a refractive index $n_1$, first and second inner cladding layers of a refractive index $n_2$ provided on both sides of the active layer, and first and second outer cladding layers of a refractive index $n_3$ ($n_1 > n_2 > n_3$).

In the semiconductor laser device, an optical waveguide mode is mainly determined by the two inner cladding layers and the two outer cladding layers when the active layer is thin, because a contribution of the active layer to the optical waveguide mode is low in a waveguide composed of the thin active layer and the respective two inner and outer layers. On the other hand, a confinement of carriers into the active layer is determined by a relation of the active layer and the two inner cladding layers. Consequently, an optical confinement is controlled separately from a carrier confinement.

The conventional semiconductor laser device, however, has a disadvantage that the separate confinement of light and carriers is not realized, where the active layer becomes thick. That is, the conventional semiconductor laser device is considered to be the same as the aforementioned typical semiconductor laser device in that a low radiation angle of an output light beam is not obtained in a state that a bandgap energy difference between the active layer and the two inner cladding layers is large, where the active layer is thick.

SUMMARY OF THE INVENTION

Accordingly, it is an object of the invention to provide a semiconductor laser device in which a radiation angle of an output light beam is small, even if an active layer is thick.

It is a further object of the invention to provide a semiconductor laser device in which a radiation angle of an output light beam is designed independently of the temperature characteristic thereof.

According to the invention, a semiconductor laser device comprises, a double heterostructure including an active layer and first and second inner cladding layers provided on both sides of the active layer, the double heterostructure being provided on a semiconductor substrate and a bandgap energy of the first and second inner cladding layers being greater than that of the active layer;

first and second outer cladding layers provided on both sides of the double heterostructure; and first and second electrodes for applying a predetermined voltage across the double heterostructure;

wherein a refractive index of the active layer is greater than a refractive index of the first and second outer cladding layers, and the refractive index of the first and second outer cladding layers is greater than a refractive index of the first and second inner cladding layers.

BRIEF DESCRIPTION OF DRAWINGS

The invention will be explained in more detail in conjunction with appended drawings wherein, FIGS. 2A and 2B are cross-sectional views showing a position of p-n junctions in the semiconductor laser device in FIG. 1, FIG. 3 is a cross-sectional view with refractive index values showing a conventional semiconductor laser device, FIG. 4 is a cross-sectional view with refractive index values showing a semiconductor laser device in an embodiment according to the invention, and FIG. 5 is a graph explaining a vertical radiation beam half value angle relative to a thickness of an active layer in the semiconductor laser device in the embodiment according to the invention.

DESCRIPTION OF A PREFERRED EMBODIMENT

Figure 1:
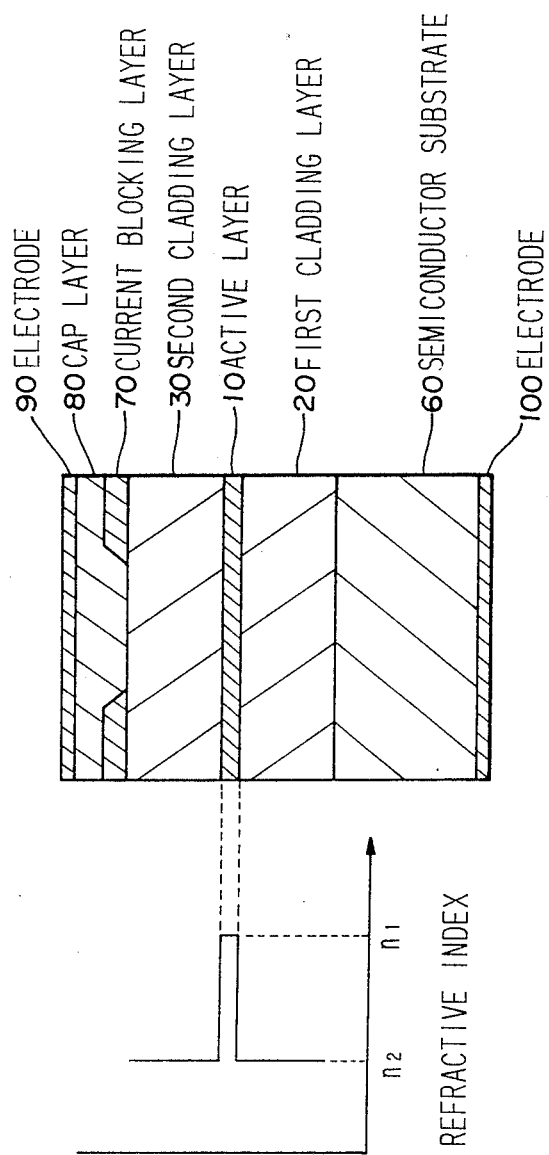
FIG. 1 is a cross-sectional view with refractive index values showing a typical semiconductor laser device in the prior art.

Before explaining a semiconductor laser device in an embodiment according to the invention, the aforementioned typical semiconductor laser device and the aforementioned conventional semiconductor laser device will be here explained again.

FIG. 1 shows the typical semiconductor laser device, a cross-section of which is vertical to a direction of a resonator, comprising a first cladding layer 20 of a refractive index $n_2$, an active layer 10 of a refractive index $n_1(n_1>n_2)$, a second cladding layer 30 of the refractive index $n_2$, a current blocking layer 70 having an aperture of a stripe shape and a cap layer 80 successively grown on a semiconductor substrate 60, a first electrode 90 provided on the cap layer 80, and a second electrode 100 provided on the back surface of the semiconductor substrate 60.

In the semiconductor laser device, a confinement of carriers is determined by a bandgap energy difference between the active layer 10 and the first and second cladding layers 20 and 30, while a vertical radiation angle of an output light beam is determined by a refractive index difference "$n_1-n_2$" of the active layer 10 and the first and second cladding layers 20 and 30. As described before, the bandgap energy difference can not be controlled independently of the refractive index difference. In general, the vertical radiation angle of the output light beam becomes large, where the bandgap energy difference is increased, so that the refractive index difference is inevitably increased.

FIGS. 2A and 2B show two examples of a p-n junction position in the semiconductor laser device of FIG. 1. In FIG. 2A, a normal state in which the p-n junction is coincident with an interface of the active layer 10 is shown. In FIG. 2B, on the other hand, an abnormal state in which the p-n junction is positioned in the first cladding layer 20 to be deviated from the interface of the active layer 10 is shown. This is called "a remote junction", and results in a deterioration of the laser characteristic. The abnormal state is a big problem to be caused by an autodoping phenomenon which is induced during a crystal growth, and is remarkably observed in an InGaAsP/InP semiconductor laser device and an AlGaInP/GaAs visible light semiconductor laser device. This phenomenon is observed during long aging tests in which a predetermined current is continuously injected into the semiconductor laser diode and results in deterioration of the semiconductor laser diode. In order to avoid the occurence of the phenomenon, the active layer 10 is desired to be as thick as approximately 0.1 $\mu$m. However, a low radiation angle of an output light beam is not obtained in a semiconductor laser device including an active layer having a thickness of 0.1 $\mu$m as described before.

FIG. 3 shows the aforementioned conventional semiconductor laser device, a cross-section of which is vertical to a direction of a resonator, comprising a first outer cladding layer 40 of a refractive index $n_3$, a first inner cladding layer 20 of a refractive index $n_2$, an active layer 10 of a refractive index $n_1$ ($n_1>n_2>n_3$), a second inner cladding layer 30 of the refractive index $n_2$, a second outer cladding layer 50 of the refractive index $n_3$, a current blocking layer 70 having an aperture of a stripe shape and a cap layer 80 successively grown on a semiconductor substrate 60, a first electrode 90 provided on the cap layer 80, and a second electrode 100 provided on the back surface of the semiconductor substrate 60, and having a structure called "a separate confinement". This separate confinement type semiconductor laser device provides an excellent advantage that a carrier confinement is controlled independently of an optical confinement, where the active layer 10 is very thin. That is, in an optical waveguide which is composed of the active layer 10, the first and second inner cladding layers 20 and 30, and the first and second outer cladding layers 40 and 50, an optical waveguide mode is mainly determined by the two inner cladding layers 20 and 30, and the two outer cladding layers 40 and 50, because the active layer 10 contributes less to the optical waveguide mode. On the other hand, the optical confinement is carried out in accordance with a relation of the active layer 10 and the first and second inner cladding layers 20 and 30.

Where the active layer 10 becomes thick in the conventional semiconductor laser device, however, it will be identical to the typical semiconductor laser device of a double heterostructure as shown in FIG. 1. Therefore, a low radiation angle of an output light beam is not obtained in the conventional semiconductor laser device including a thick active layer in a state that a bandgap energy difference between the active layer 10 and the first and second inner cladding layers 20 and 30 is large.

Next, a semiconductor laser device in the embodiment according to the invention will be explained in FIG. 4. The semiconductor laser device is of an AlGaInP visible light semiconductor laser device which comprises a first outer cladding layer 40 of a refractive index $n_3$, a first inner cladding layer 20 of a refractive index $n_2$, an active layer of a refractive index $n_1(n_1>n_3>n_2)$, a second inner cladding layer 30 of the refractive index $n_2$, a second outer cladding layer 50 of the refractive index $n_3$, a current blocking layer 70 having an aperture of a stripe shape and a cap layer 80 successively grown on a semiconductor substrate 60, a first electrode 90 provided on the cap layer 80, and a second electrode 100 provided on the back surface of the semiconductor substrate 60.

In fabricating the semiconductor laser device, the first outer cladding layer 40 of $(Al_{0.33}Ga_{0.67})_{0.5}In_{0.5}P$ doped with Se having a thickness of 1.5 $\mu$m, the first inner cladding layer 20 of $(Al_{0.4}Ga_{0.6})_{0.5}In_{0.5}P$ doped with Se having a thickness of 0.1 μm, the active layer 10 of non-doped $Ga_{0.5}In_{0.5}P$ having a thickness of 0.1 μm, the second inner cladding layer 30 of $(Al_{0.4}Ga_{0.6})_{0.5}In_{0.5}P$ doped with Zn having a thickness of 0.1 μm, the second outer cladding layer 50 of $(Al_{0.33}Ga_{0.67})_{0.5}In_{0.5}P$ doped with Zn having a thickness of 1.5 μm and the current blocking layer 70 of GaAs doped with Se having a thickness of 0.5 μm are successively grown on the semiconductor substrate 60 of GaAs, after a buffer layer of GaAs (not shown) is grown on the semiconductor substrate 60, so that a double heterostructure wafer for a laser device is fabricated. Then, a stripe shaped portion of the current blocking layer 70 is removed to provide the aperture, and the cap layer 80 of GaAs doped with Zn having a thickness of 1.5 μm is grown thereon. The crystal growth is carried out at the above fabricating stage by Metalorganic Vapor Phase Epitaxy or Molecular Beam Epitaxy. An Al composition ratio of the AlGaInP crystal for the first and second inner cladding layers 20 and 30 is greater than that for the first and second outer cladding layers 40 and 50 to provide the above described refractive index distribution, because a refractive index of the AlGaInP crystal is decreased as the Al composition ratio is increased. As clearly from the above, a specific crystal growth process is not required in the invention. Thereafter, the first and second electrodes 90 and 100 are provided on the top and back surfaces of the double heterostructure wafer, and cleavages which will be laser resonant planes are provided on the both sides of the wafer to provide the semiconductor laser device.

In the semiconductor laser device, a vertical radiation angle of an output light beam is determined by a structure of the whole waveguide composed of the active layer 10, the first and second inner cladding layers 20 and 30, and the first and second outer cladding layers 40 and 50. In other words, the vertical radiation angle is not determined only by a combination of the active layer 10 and the first and second inner cladding layers 20 and 30. Therefore, the vertical radiation angle is controlled in accordance with a thickness of the first and second inner cladding layers 20 and 30, and the refractive index $n_3$ of the first and second outer cladding layers 40 and 50, which are parameters newly introduced in the invention.

The principle of the invention will be clarified when the structure of FIG. 4 is substituted by the structure of a typical slub waveguide of FIG. 1. That is, it is assumed that the active layer 10 and the first and second inner layers 20 and 30 are a single layer which is sandwiched by the first and second outer cladding layers 40 and 50. In this assumption, a refractive index $n_0$ of the single layer is less than that $n_1$ of the active layer 10 and greater than that $n_2$ of the two inner cladding layers 20 and 30 ($n_1 > n_0 > n_2$). The refractive index $n_3$ of the first and second outer layers 40 and 50 is the same relation to the refractive indices $n_1$ and $n_2$ as the refractive index $n_0$ ($n_1 > n_3 > n_2$). Where the refractive index $n_3$ is designed to be proximate to and less than the refractive index $n_0$, a slub waveguide having a low refractive index difference "$n_0-n_3$" is realized in the invention, so that a vertical radiation angle of an output light beam can be small, even if a bandgap energy difference is large between the active layer 10 and the first and second inner cladding layers 20 and 30.

The invention will be explained in more detail with use of practical calculation examples of the refractive indices $n_1$, $n_2$ and $n_3$ as shown in FIG. 5. Here, it is assumed that the refractive indices $n_1$ and $n_2$ are 3.53 and 3.38, respectively, and that the refractive index $n_3$ is changed to be 3.38, 3.41 and 3.44 in three examples, respectively. Where a thickness of the first and second inner cladding layers 20 and 30 is 0.1 μm as described before, and the refractive index $n_3$ is 3.38, the structure of FIG. 4 will be identical to that of FIG. 1. Therefore, a thickness of the active layer 10 must be 0.06 μm to provide a vertical radiation angle of 20 degrees at a half value angle in the typical semiconductor laser device in the prior art as shown in FIG. 1 ($n_3 = 3.38$), while a thickness of the active layer 10 is increased to be 0.1 μm in the invention ($n_3 = 3.41$). Although a thickness of the first and second inner cladding layers 20 and 30 is 0.1 μm, it may be varied dependent on a desired vertical radiation angle. That is, the vertical radiation angle can be varied by changing a thickness of the first and second inner cladding layers 20 and 30, and the refractive index $n_3$ of the first and second outer cladding layers 40 and 50. Practically, a bandgap energy difference between the active layer 10 and the first and second inner cladding layers 20 and 30, and a thickness of the active layer 10 are determined in consideration of the temperature characteristic and the doping control at first. Thus, a half value angle of the vertical radiation angle is controlled to be an arbitrary angle in accordance with a thickness of the first and second inner cladding layers and the refractive index $n_3$ of the first and second outer cladding layers 40 and 50.

As described repeatedly, the temperature characteristic can be designed separately from a radiation angle of an output light beam in the invention. Here, where an AlGaInP visible light semiconductor laser device is discussed in regard to the temperature characteristic especially, it is reported that the temperature characteristic depends greatly on a bandgap energy difference between an active layer and cladding layers, and that, where the cladding layers are of $(Al_{0.4}Ga_{0.6})_{0.5}In_{0.5}P$, a characteristic temperature of threshold current $T_0$ is 60K, and where the cladding layers are of $(Al_{0.7}Ga_{0.3})_{0.5}In_{0.5}P$, it is 120K. In accordance with this report, it is considered difficult that a semiconductor laser device with a thin active layer having a characteristic temperature $T_0$ of 100K and a vertical radiation beam half value angle of 20° is fabricated without including a structure of the invention.

As a matter of course, the invention is not limited to an AlGaInP visible ray semiconductor laser device, but applied to other semiconductor materials.

Although the invention has been described with respect to specific embodiment for complete and clear disclosure, the appended claims are not thus limited but are to be construed as embodying all modification and alternative constructions that may occur to one skilled in the art which fairly fall within the basic teaching herein set forth.

What is claimed is:

1. A semiconductor laser device, comprising:
    a double heterostructure including an active layer and first and second inner cladding layers provided on both sides of said active layer, said double heterostructure being provided on a semiconductor substrate and a bandgap energy of said first and second inner cladding layers being greater than that of said active layer;
    first and second outer cladding layers provided on both sides of said double heterostructure; and first and second electrodes for applying a predetermined voltage across said double heterostructure;
wherein a refractive index of said active layer is greater than a refractive index of said first and second outer cladding layers, and said refractive index of said first and second outer cladding layers is greater than a refractive index of said first and second inner cladding layers 2. A semiconductor laser device, according to claim 1 wherein:
said first and second inner cladding layers are of a thickness dependent on a vertical radiation angle of an output light beam, and said first and second outer cladding layers are of a refractive index dependent on said vertical radiation angle.

* * * * *